United States Patent [19]

Hayakawa et al.

[11] Patent Number: 4,941,024

[45] Date of Patent: Jul. 10, 1990

[54] SEMICONDUCTOR APPARATUS

[75] Inventors: Toshiro Hayakawa, Nara; Takahiro Suyama, Tenri; Saburo Yamamoto, Nara, all of Japan

[73] Assignee: Sharp Kabushiki Kaisha, Osaka, Japan

[21] Appl. No.: 256,097

[22] Filed: Oct. 11, 1988

Related U.S. Application Data

[63] Continuation of Ser. No. 757,977, Jul. 23, 1985, abandoned.

[30] Foreign Application Priority Data

Jul. 31, 1984 [JP] Japan ................... 59-163213

[51] Int. Cl.$^5$ ............................................. H01L 27/12
[52] U.S. Cl. ........................................ 357/4; 357/16; 357/55; 357/60; 357/68; 357/71
[58] Field of Search ................... 357/4, 16, 17, 55, 60, 357/68, 71

[56] References Cited

U.S. PATENT DOCUMENTS

| 4,591,889 | 5/1986 | Gossard et al. | 357/16 |
| 4,599,787 | 7/1986 | Sasatani | 357/16 |
| 4,644,378 | 2/1987 | Williams | 357/17 |

FOREIGN PATENT DOCUMENTS 2115608 7/1983 United Kingdom .
2164206 3/1986 United Kingdom .

OTHER PUBLICATIONS

Appl. Phys. Lett., 44 (1984), pp. 325–327.
Appl. Phys. Lett., 43 (1983), pp. 345–347.
IEEE Electron Device Letters, EDL-3 (1982), pp. 305–307.

Primary Examiner—Edward J. Wojciechowicz
Attorney, Agent, or Firm—Armstrong, Nikaido, Marmelstein, Kubovcik & Murray

[57] ABSTRACT

A semiconductor apparatus comprises a step-shaped substrate and a multiple-layered crystal structure formed on the substrate, said multiple-layered crystal structure is of a superlatticed layer which is composed of alternate layers consisting of plural thin layers grown by molecular beam epitaxy.

5 Claims, 1 Drawing Sheet

SEMICONDUCTOR APPARATUS

This application is a continuation of application Ser. No. 757,977 filed July 23, 1985, now abandoned.

BACKGROUND OF THE INVENTION

1. Field of the invention:

This invention relates to a semiconductor apparatus of the GaAlAs system, which is produced using a single crystal growth technique for the formation of thin films with high precision such as molecular beam epitaxy; etc. More particularly, it relates to a semiconductor apparatus containing a semiconductor laser and/or an optical integrated circuit, which is provided with high conductive semiconductor layers having improved crystallization in the region containing a step-shaped portion.

2. Description of the prior art:

With significant advancements in such fields as optical information processing, light communication, etc., optoelectronic integrated circuits (OEIC) containing optical semiconductor devices (such as semiconductor lasers, etc.) and optical semiconductor devices and electrical circuit devices on the same substrate have been developed based on the use of molecular beam epitaxy as a single crystal growth technique which can result in crystal layers having a regulated and uniform thickness. However, when semiconductor layers are grown by molecular beam epitaxy on a region containing a step-shaped portion within a crystal structure, the following problems (which do not arise in crystal growth by liquid phase epitaxy and metal-organic chemical vapor deposition) arise:

PROBLEM 1

FIG. 2 shows a conventional index waveguide type semiconductor laser of the GaAlAs system, which can be produced, using molecular beam epitaxy, as follows: On an n-GaAs substrate 1, an n-$Ga_{0.7}Al_{0.3}As$ cladding layer (the thickness thereof being 1.5 $\mu$m)2, a non-doped GaAs active layer (the thickness thereof being 0.1 $\mu$m)3, a p-$Ga_{0.7}Al_{0.3}As$ cladding layer (the thickness thereof being 0.15 $\mu$m)4 and an n-GaAs current constricting layer (the thickness thereof being 0.8 $\mu$m)5 are successively grown by molecular beam epitaxy, followed by etching the current constricting layer 5 to the extent that the etching reaches the cladding layer 4 to result in a striped channel 50 at the position corresponding to the laser oscillation area. Then, on the current constricting layer 5 having the striped channel 50, a p-$Ga_{0.7}Al_{0.3}As$ cladding layer (the thickness thereof being 0.8 $\mu$m)6 and a p-GaAs cap layer (the thickness thereof being 0.3 $\mu$m)7 are successively grown by molecular beam epitaxy to thereby superpose the upper cladding layer 6 on the lower p-cladding layer 4 through the striped channel 50 of the current constricting layer 5, followed by the formation of an n-side electrode 8 and a p-side electrode 9 on the substrate 1 and the cap layer 7, respectively, resulting in a semiconductor laser device.

Each of the single crystals which were formed by the second molecular beam epitaxial growth in the above-mentioned process, lacks continuity at the portions 10 of the upper cladding layer 6 and the cap layer 7, which grew in accordance with the angular portions in the striped channel 50 of the current constricting layer 5, and thus it can be assumed to be a twin, which causes a non-uniform current distribution therein, resulting in an undesired influence on stabilization of the transverse mode of the semiconductor laser.

PROBLEM 2

FIG. 3 shows an OEIC, containing a field effect transistor and a semiconductor laser, which is produced using molecular beam epitaxy, as follows: on a GaAs semi-insulating step-shaped substrate 11, an n-GaAs wiring layer 12 for subsequently electrically connecting the field effect transistor to the semiconductor laser is grown, and then subjected to an etching treatment to remove the area of the wiring layer 12 on the upper portion of the step-shaped substrate 11 at which the field effect transistor should be positioned. Then, the field effect transistor having a source region 19, a channel region 20, a drain region 21, a source electrode 22, a gate electrode 23 and a drain electrode 24 is formed on the substrate 11 by an ion implantation method, while the doubleheterostructure semiconductor laser having an n-$Ga_{0.7}Al_{0.3}As$ cladding layer 13, a non-doped GaAs active layer 14 a p-$Ga_{0.7}Al_{0.3}As$ cladding layer 15, a p-GaAs cap layer 16, a $SiO_2$ film 17 with a striped structure, and a p-side electrode 18 is formed on the same substrate 11 by an epitaxial growth technique, resulting in the OEIC, wherein since the top of the field effect transistor is flush with that of the semiconductor laser, the growth of the crystals in the photolithographic process can be easily carried out. However, if the n-GaAs wiring layer 12 were grown by molecular beam epitaxy, it would lack continuity at the portion 10 thereof, which grows in accordance with the angular portion of the step-shaped substrate 11, and thus it can be assumed to be a twin, which causes such undesired influence as the rectification of a transverse current flow within the n-GaAs wiring layer when silicon is used as an n-impurity for the n-GaAs wiring layer.

SUMMARY OF THE INVENTION

The semiconductor apparatus of this invention which overcomes the above-discussed and numerous other disadvantages and deficiencies of the prior art, comprises a step-shaped substrate and a multiple-layered crystal structure formed on the substrate. The multiple-layered crystal structure is of a superlatticed layer which is composed of alternate layers consisting of plural thin layers grown by molecular beam epitaxy.

The superlatticed layer consists of, in a preferred embodiment, one selected from the GaAs and GaAlAs, GaAs and AlAs, GaAlAs and AlAs, or GaAs, GaAlAs and AlAs systems.

The superlatticed layer is, in a preferred embodiment, a wiring layer for connecting an optical semiconductor device area formed on the lower portion of the step-shaped substrate to an electric circuit device area formed on the upper portion of the step-shaped substrate.

Thus, the invention described herein makes possible the objects of (1) providing a substrate, for optical semiconductor devices having excellent operation characteristics and reliability, in which a superlatticed crystal structure of high quality and highly conductive semiconductor layers is formed on a step-shaped substrate by molecular beam epitaxy; (2) providing a novel optical semiconductor apparatus containing a superlatticed crystal structure; and (3) providing a semiconductor device in which there is no influence from the step of a step-shaped structure upon the crystals grown on the step by the use of a single crystal growth technique for the formation of thin films with high precision such as molecular beam epitaxy.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
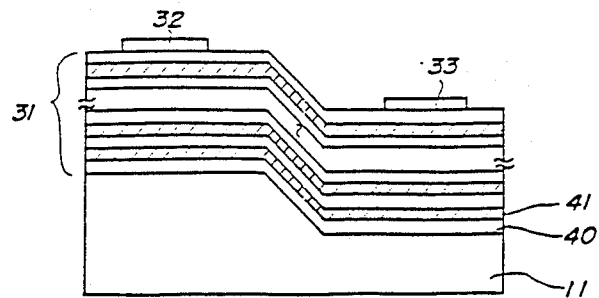
FIG. 1 is a sectional view showing a substrate of a superlatticed structure for semiconductor devices of this invention.
Figure 3:
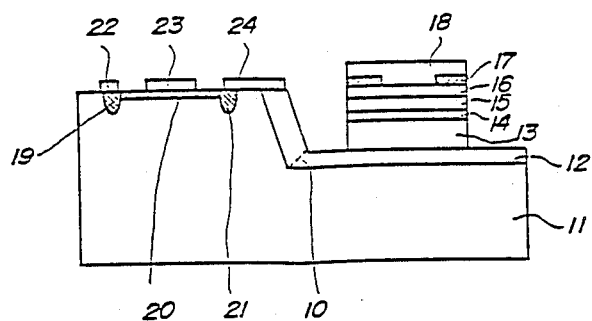
FIG. 3 is a sectional view showing a conventional optoelectronic integrated circuit produced using molecular beam epitaxy.

FIG. 1 shows a substrate for semiconductor devices of this invention, which was produced as follows:

On a GaAs semi-insulating substrate 11 which was etched into a step shape, in advance, a superlatticed layer 31 which was composed of alternate layers consisting of one hundred Si doped n-GaAs layers (the thickness of each layer being 50 Å)40 and one hundred n-$Ga_{0.5}Al_{0.5}As$ layers (the thickness of each layer being 50 Å)41 was formed by molecular beam epitaxy. Then, in order to examine the characteristics of the resulting step-shaped superlatticed layer 31, a metal of Au-Ge-Ni was disposed by a masking evaporation technique on the upper portion and the lower portion of the step-shaped superlatticed layer 31, and then alloyed by a heat treatment, etc., to form electrodes 32 and 33. It was confirmed that the superlatticed layer 31 provides excellent conductivity characteristics since rectification of the current and voltage characteristics between the electrodes 32 and 33 could not be observed. By the use of a substrate having this step-shaped superlatticed structure instead of the wiring layer 12 of the OEIC in FIG. 3, a semiconductor apparatus having improved characteristics with respect to rectification can be obtained.

Figure 2:
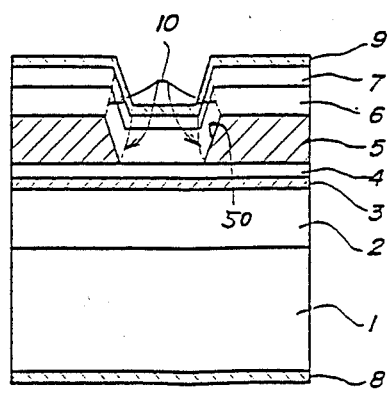
FIG. 2 is a sectional view showing a conventional semiconductor laser produced using molecular beam epitaxy.

Moreover, instead of the upper cladding layer 6 of the semiconductor device in FIG. 2, a superlatticed layer which is composed of alternate layers consisting of eighty Be doped p-GaAs layers (the thickness of each layer being 50 Å) and eighty p-$Ga_{0.4}Al_{0.6}As$ layers (the thickness of each layer being 50 Å) can be used. This superlatticed layer can be assumed to be equivalent to a p-$Ga_{0.7}Al_{0.3}As$ layer having an AlAs mole fraction of 0.3 in the GaAlAs mixed crystal. Thus, the afore-mentioned problems such as the formation of a twin at the angular portions 10 can be solved, thereby allowing the superlatticed layer to provide excellent electrical characteristics as the upper cladding layer in FIG. 2.

The donor level of a $Ga_{1-x}Al_xAs$ layer (reference numeral x being the AlAs mole fraction) becomes gradually deeper with an increase in the value of x. When x is approximately 0.36, the donor level is the deepest (i.e., approximately 160 meV from the bottom of the conduction band). Generally, as the donor level becomes deeper, an increase in the electron density must be suppressed, resulting in blunt electrical characteristics of the GaAlAs layer. On the other hand, if a GaAs-GaAlAs superlatticed layer, which is composed of alternate layers consisting of around ten to one hundred GaAs layers (the thickness of each layer being as thin as several tens Å) and around ten to one hundred $Ga_{1-x}Al_xAs$ layers (the thickness of each layer being as thin as several tens Å) were formed, the donor level of the superlatticed layer would not be deep enough as a whole so that the superlatticed layer can be assumed to be equivalent to a $Ga_{1-x/2}Al_{x/2}As$ layer having an improved electrical density. If silicon were doped as a donor impurity into the GaAs layer, the donor level of the resulting superlatticed layer would exhibit as small as about 5 meV, as well. Thus, a superlatticed layer which is composed of alternate layers consisting of plural Si doped GaAs layers and plural non-doped GaAlAs layers such that the Si atoms can be isolated from the Al atoms can be assumed to be equivalent to a GaAlAs layer having a most remarkably improved electron density.

Since the superlatticed layer can be formed by molecular beam epitaxy, it has a high electron density, resulting in improved electrical characteristics, as compared with a single $Ga_{1-x}Al_xAs$ layer ranging in the mixed crystal ratio of from about 0.3 to about 0.5. The superlatticed layer is composed of alternate layers consisting of a plurality of extremely thin layers, so that no twin arises in the crystal layers grown in accordance with the angular portions corresponding to the step-shaped ground and each of the crystal layers can be grown as a uniform layer. Moreover, even when Si is used as a donor impurity in the GaAs layer, the resulting superlatticed layer does not exhibit a transverse rectification, but electrons within the GaAs layer are spread over the whole superlatticed layer by the tunnel effect with a higher energy than the quantized conduction band since the thickness of each of the thin layers constituting the superlatticed layer is less than the wavelength of each of the electrons, so that the superlatticed layer can exhibit sensitive electrical characteristics.

A semiconductor apparatus of this invention having the function of modulation, in which the field effect transistor and the semiconductor laser device are integrated onto the GaAs step-shaped substrate 11 can be produced such that the above-mentioned superlatticed layer is disposed on the GaAs step-shaped substrate 11 and the field effect transistor is then formed on the upper portion of the step-shaped substrate, followed by connecting the end of the superlatticed layer to the drain electrode of the field effect transistor, while the doubleheterostructure semiconductor laser device is formed on the lower portion of the step of the superlatticed layer. Instead of the semiconductor laser device, a photodiode can be used for the semiconductor apparatus of this invention, wherein the superlatticed layer serves as not only a carrier injection source for the optical semiconductor device, but also a wiring layer for connecting the optical semiconductor device to the field effect trnasistor, which has the functions of a switch for the laser light and/or modulation for the strength of the laser output power from the optical semiconductor device.

The superlatticed layer can be used, as mentioned above, as a layer component having uniform electrical characteristics for the layer containing the step-shaped portions in the semiconductor laser device of the doubleheterostructure and/or the optical semiconductor device of the multiple-layered crystal structure shown in FIG. 2, resulting in an optical semiconductor apparatus having stabilized operation characteristics. The thickness of each of the thin layers constituting the superlatticed layer can be controlled to alter the band gap of the superlatticed layer. The band gap is determined by a difference between the quantization levels of electrons and positive holes in the GaAs potential well. These quantization levels depend upon the thickness of each of the thin layers constituting the superlatticed layer.

Although only OEICs and semiconductor laser devices using a superlatticed structure composed of the GaAs and GaAlAs systems were described in the aforementioned examples, the superlatticed structure can be also formed by the combination of the GaAs and AlAs, the GaAlAs and AlAs, or the GaAs, GaAlAs and AlAs systems.

As the semiconductor device, not only the above-mentioned optical semiconductor devices, but also any semiconductor device having semiconductor layers which can be grown on the step-shaped structure by molecular beam epitaxy can be used.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty which reside in the present invention, including all features which would be treated as equivalents thereof by those skilled in the art to which this invention pertains.

What is claimed is:

1. A semiconductor apparatus comprising:
   a step-shaped substrate;
   a multiple-layered step-shaped crystal structure formed on said step-shaped substrate, said multiple-layered crystal structure being of a superlatticed layer which is composed of a plurality of alternate thin layers consisting of first and second semiconductor material of a uniform thickness throughout each layer, each layer being grown by molecular beam epitaxy in accordance with angular portions of said step-shaped substrate without formation of a twin; and
   electrodes formed on an upper portion and a lower portion of said multiple-layered step-shaped crystal structure.

2. A semiconductor apparatus according to claim 1, wherein said superlatticed layer consists of one selected from the GaAs and GaAlAs, GaAs and AlAs, GaAlAs and AlAs, or GaAs, GaAlAs and AlAs systems.

3. A semiconductor apparatus according to claim 1, wherein said superlatticed layer is a wiring layer for connecting an optical semiconductor device area formed on the lower portion of said multiple-layered step-shaped crystal structure to an electric circuit device area formed on the upper portion of said multiple-layered step-shaped crystal structure.

4. A semiconductor apparatus comprising:
   a substrate; and
   a multiple-layered step-shaped crystal structure formed on said substrate, said multiple-layered step-shaped crystal structure having a step-shaped portion of an upper, lower and middle portion and comprising a superlatticed layer which covers said step-shaped portion, said superlatticed layer being composed of a plurality of alternate thin layers consisting of first and second semiconductor material of a uniform thickness throughout each layer, each layer being grown by molecular beam epitaxy in accordance with angular portions of said step-shaped portion without formation of a twin; and
   electrodes formed on upper and lower portions of said multiple-layered step-shaped crystal structure.

5. A semiconductor apparatus according to claim 4, wherein said superlatticed layer consists of one selected from the GaAs and GaAlAs, GaAs and AlAs, GaAlAs and AlAs, or GaAs, GaAlAs and AlAs systems.

* * * * *